April 28, 1936. W. L. CARLSON Re. 19,945

RADIO APPARATUS

Original Filed May 23, 1927

Inventor:
Wendell L. Carlson,
by Alexander S. Lunt,
His Attorney.

Reissued Apr. 28, 1936

Re. 19,945

UNITED STATES PATENT OFFICE 19,945

RADIO APPARATUS

Wendell L. Carlson, Haddonfield, N. J., assignor to General Electric Company, a corporation of New York Original No. 1,871,405, dated August 9, 1932, Serial No. 193,438, May 23, 1927. Application for reissue August 3, 1934, Serial No. 738,330

19 Claims. (Cl. 178—44)

My invention relates to radio apparatus, and has for its principal object the provision of an improved amplifying and detecting apparatus which may be readily adjusted to operate either with a high degree of fidelity or with a high degree of selectivity.

When broadcast stations are operated at frequencies spaced apart by 10 kilocycles, it is difficult to operate receiving apparatus with high quality and sharp selectivity without reverting to single side band transmission. It is of course possible to operate such apparatus with a moderate degree of adjacent channel selectivity and with cutoff on the higher modulation frequencies. Practical tests show that the best quality of reception is obtained with a high fidelity adjustment for local reception and with a poor fidelity and high selectivity adjustment for distant reception through interference. In accordance with my invention, the receiving apparatus is arranged to be readily changed from a condition of high fidelity with regard to the signals of a plurality of adjacent frequency bands or channels to a condition of high selectivity for distant reception through interference.

My invention will be better understood from the following description when considered in connection with the accompanying drawing and its scope will be pointed out in the appended claims.

Figure 1:
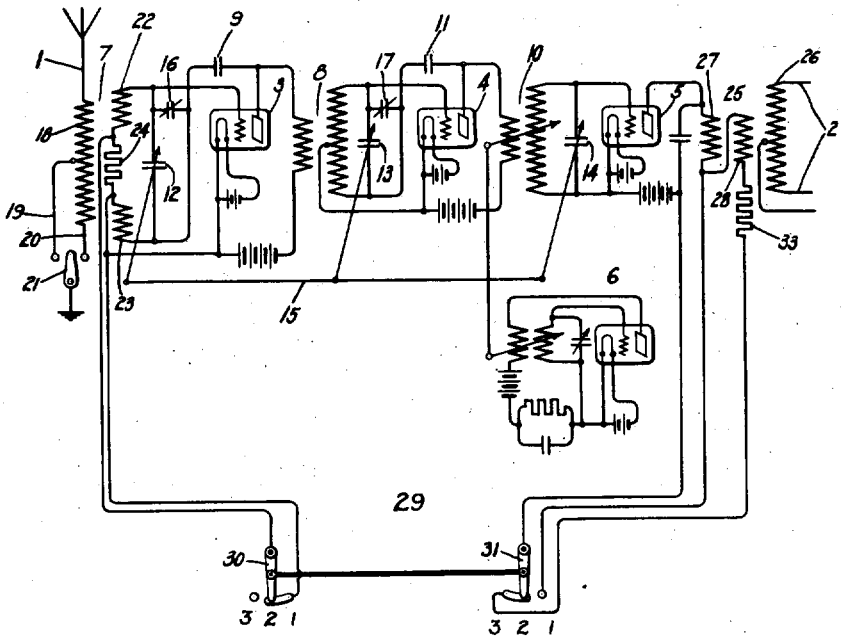
Figure 2:
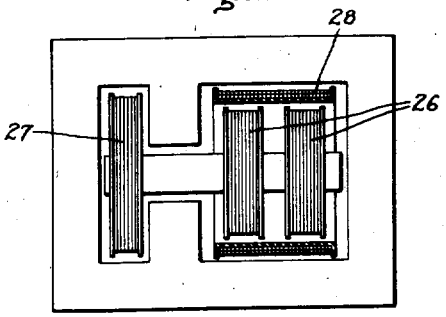

Referring to the drawing, Fig. 1 is a wiring diagram of a radio receiving apparatus wherein my invention has been embodied; and Fig. 2 illustrates a coupling transformer constructed in accordance with my invention.

The receiving apparatus illustrated by Fig. 1 comprises an antenna 1 and a circuit 2 which are interconnected through a plurality of space discharge devices comprising a pair of radio frequency amplifiers 3 and 4 and a heterodyne detector 5 coupled to the output circuit of a local oscillation generator 6. The amplifier 3 is provided with an input circuit coupled to the antenna 1 through a transformer 7, with an output circuit coupled to the input circuit of the amplifier 4 through a transformer 8 and with a condenser 9 for neutralizing the capacity coupling between its anode and grid. The amplifier 4 is likewise provided with an output circuit coupled to the input circuit of the detector 5 through a transformer 10, and with a condenser 11 for neutralizing the capacity between its grid and anode. Tuning condensers 12, 13 and 14 connected respectively in the input circuits of the devices 3, 4 and 5 are arranged to be adjusted by a single control member 15. In order to ensure the proper relation between the capacities of the different tuning condensers, compensating condensers 16 and 17 are connected in parallel with the tuning condensers 12 and 13.

The transformer 7 is provided with a primary winding 18 arranged to be connected to ground either through a lead 20 and a switch 21 or through lead 19 and switch 21 and with a secondary winding comprising sections 22 and 23 between which are interposed a resistor 24. The output circuit of the detector 5 is arranged to be coupled to the circuit 2 through a transformer 25 comprising a secondary winding 26 and primary windings 27 and 28. A switching device 29 comprising movable contact members 30 and 31 is provided for controlling the connections of the resistor 24, the primary circuit 27 and the primary circuit 28 which is connected in series with a resistor 33. As indicated more clearly in Fig. 2, the secondary windings 26 are loosely coupled to the primary winding 27 and closely coupled to the primary winding 28.

The switch 29 is operable to three different positions. Assuming this switch to be in its right hand position, the resistor 24 is short circuited, the winding 28 and resistor 33 are open circuited, and the apparatus is highly selective but operates with poor fidelity due to attenuation of the higher modulation side band frequencies. The fidelity of the apparatus is greatly increased by operating the switch 29 to its illustrated position and connecting the winding 27 in series with the winding 28 and resistor 33. Operation of the switch 29 to its left hand position removes the short circuit from the resistor 24 and increases to some extent the fidelity of the apparatus.

It will of course be understood that connecting the winding 28 in series with the winding 27 produces a closer coupling between the output circuit of the detector 5 and the circuit 2 and broadens the frequency range of the receiving apparatus, and that the effect of the resistor 33 is to equalize the response at different frequencies within the range.

The embodiment of the invention illustrated and described herein has been selected for the purpose of clearly setting forth the principles involved. It will be apparent however that the invention is susceptible of being modified to meet the different conditions encountered in its use and I therefore aim to cover by the appended claims all modifications within the true spirit and scope of my invention.

What I claim as new and desire to secure by Letters Patent of the United States is:

1. The combination of a space discharge device provided with an output circuit, a transformer comprising a secondary winding and two primary windings respectively loosely and closely coupled to said secondary winding, and switch means associated with said output circuit, said switch means in one position thereof completing said circuit through one of said primary windings and in another position completing said circuit through both of said primary windings.

2. The combination of a space discharge device provided with an output circuit, a transformer comprising a secondary winding and two primary windings respectively loosely and closely coupled to said secondary winding, a resistor, and switch means associated with said circuit, said switch means in one position thereof completing said circuit through one of said primary windings and in another position completing said circuit through both of said primary windings and said resistor.

3. The combination of a space discharge device provided with an output circuit, a transformer comprising a secondary winding and two primary windings respectively loosely and closely coupled to said secondary winding, resistance means, and switch means associated with said circuit, said switch means in one position thereof completing said circuit through said loosely coupled winding and in another position completing said circuit through both of said windings and said resistance means.

4. The combination of a space discharge device provided with an output circuit, a transformer comprising a secondary winding and two primary windings respectively loosely and closely coupled to said secondary winding, and switch means associated with said output circuit, said switch means in one position thereof completing said circuit through said loosely coupled winding and in another position thereof connecting said primary windings to said circuit in series with one another.

5. An apparatus comprising an amplifier and a detector each provided with input and output circuits, a resistor in the input circuit of the amplifier and a coupling impedance in the output circuit of the detector for decreasing the selectivity and increasing the fidelity of the apparatus, and switch means associated with said input circuit of said amplifier and with said output circuit of said detector, said switch means being operable to remove said resistor from the amplifier input circuit and said impedance from the detector output circuit, whereby said apparatus may be changed from a condition of high fidelity with decreased selectivity with regard to signals of a plurality of adjacent frequency bands or channels to a condition of high selectivity and decrease of fidelity with regard to distant reception through interference.

6. An apparatus comprising an amplifier and a detector provided with input and output circuits, a transformer comprising a secondary winding and primary windings respectively loosely and closely coupled to said secondary winding, switch means associated with the output circuit of said detector, said switch means in one position thereof connecting one of said primary windings in the output circuit of the detector and in another position connecting all of said primary windings in the output circuit of said detector, and means for simultaneously tuning the input circuits of said amplifier and detector.

7. An apparatus comprising an amplifier and a detector provided with input and output circuits, a transformer comprising a secondary winding and primary windings respectively loosely and closely coupled to said secondary winding, switch means associated with the output circuit of said detector, said switch means in one position thereof connecting one of said primary windings in the output circuit of the detector and in another position connecting all of said primary windings in the output circuit of said detector, means for simultaneously tuning the input circuits of said amplifier and detector, and means connected to one of said input circuits for causing a predetermined relation to be maintained between the tuning of said input circuits.

8. An apparatus comprising an amplifier and a detector, said amplifier being provided with a tuned input circuit including a resistor and said detector being provided with an output circuit including a pair of primary windings and a resistor in series, said first-named resistor and one of said primary windings being adapted to decrease the selectivity and increase the fidelity of the apparatus, and switch means associated with said input circuit of said amplifier and with said output circuit of said detector, said switch means being operable to short circuit said first-named resistor and to open circuit said one of said primary windings simultaneously whereby the circuit constants of said input circuit and of said output circuit may be changed simultaneously to change the operating characteristic of said apparatus from one of high fidelity to one of high selectivity.

9. The combination of a space discharge device provided with an output circuit, a transformer comprising a secondary winding and two primary windings respectively loosely and closely coupled to said secondary winding, and switch means associated with said output circuit, said switch means in one position thereof completing said circuit through said loosely coupled primary winding and in another position completing said circuit through both of said primary windings.

10. An apparatus comprising an amplifier and a detector provided with input and output circuits, a transformer comprising a secondary winding and two primary windings respectively loosely and closely coupled to said secondary winding, switch means associated with said output circuit, said switch means in one position thereof completing said circuit through said loosely coupled primary winding and in another position completing said circuit through both of said primary windings, and means for simultaneously tuning the input circuits of said amplifier and detector.

11. In a system for transmitting a band of signals, the combination with a pair of circuits, and coupling between said circuits, of means for narrowing the acceptance frequency band to provide high selectivity transmission in said system and subsequently to widen the acceptance frequency band to provide high fidelity transmission in said system, said means including means for simultaneously changing the magnitude of the coupling between said circuits and the resistance of one of said circuits, said resistance after said change being of a value sufficient substantially to equalize the response of said system over said widened acceptance frequency band.

12. In a system for transmission of a band of signals, the combination with two circuits one of which is adapted to include a resistance, and magnetic coupling between said circuits, of means for widening the acceptance frequency band to provide high fidelity transmission in said system after a period of operation characterized by a narrow acceptance frequency band providing high selectivity transmission in said system, said means including means for simultaneously increasing the coupling between said circuits and for including said resistance in said one of the circuits, said resistance having a value sufficient substantially to equalize the response of said system over said widened acceptance frequency band.

13. In a system for transmitting a band of signals, the combination with two circuits one of which is adapted to include a resistance, and magnetic coupling between said circuits, of means for widening the acceptance frequency band to provide high fidelity transmission in said system after a period of operation characterized by a narrow acceptance frequency band providing high selectivity transmission in said system., said means including means for simultaneously increasing the degree of coupling between said circuits and for including said resistance in said one of the circuits, the value of said included resistance being sufficient to insure that after said increase in the degree of said coupling the response of said system over said widened frequency band is substantially equalized.

14. The combination of a space discharge device, an output transformer for said discharge device comprising primary and secondary circuits, a plurality of windings for said transformer, a resistor, a first one of said windings being loosely coupled to a second one of said windings, a third one of said windings being closely coupled to said second winding, and means operable to connect selectively said first one of said windings operatively in one of said circuits and to connect said first winding, said third winding and said resistor operatively in one of said circuits.

15. In a system for transmitting a band of signals of radio frequency, means to narrow the acceptance frequency band to provide high selectivity transmission in said system and subsequently to widen the acceptance frequency band to provide high fidelity transmission in said system, said means including two circuits and resistance means and further including means operable to couple said circuits loosely and operable subsequently to couple said circuits closely and simultaneously to connect said resistance in operative relation with one of said circuits.

16. In a system for transmitting a band of signals of radio frequency, the method of operation which includes narrowing the acceptance frequency band at the will of the operator to provide high selectivity transmission in said system, and subsequently widening the acceptance frequency band and simultaneously substantially equalizing the response of said system over said widened acceptance frequency band at the will of the operator to provide high fidelity transmission in said system.

17. In a transmission system, the combination with two pairs of circuits, and coupling between the circuits of each pair, of means to provide high selectivity transmission in said system and subsequently to provide high fidelity transmission in said system, said means including means for simultaneously changing the magnitude of the coupling between the circuits of one of said pairs of circuits, the resistance of one of the circuits of said one of said pairs, and the resistance of one of the circuits of the other of said pairs.

18. In a system for transmitting a band of frequencies, the combination with a transformer, of means for narrowing the acceptance frequency band to provide high selectivity transmission in said system and subsequently to widen the acceptance frequency band to provide high fidelity transmission in said system, said means including means for simultaneously changing the magnitude of the coupling in said transformer and the resistance of said transformer, said resistance after said change being of a value sufficient substantially to equalize the response of said system over said widened acceptance frequency band.

19. In a transmission system, the combination with two transformers, of means to provide high selectivity transmission in said system and subsequently to provide high fidelity transmission in said system, said means including means for simultaneously changing the magnitude of the coupling in one of said transformers, the resistance of said one of said transformers, and the resistance of the other of said transformers.

WENDELL L. CARLSON.